(12) United States Patent
Smith et al.

(10) Patent No.: US 7,418,644 B2
(45) Date of Patent: Aug. 26, 2008

(54) SYSTEM FOR ERROR CORRECTION CODING AND DECODING

(75) Inventors: Kenneth Kay Smith, Boise, ID (US); Jonathan Jedwab, Vancouver (CA); James A. Davis, Richmond, VA (US); David Banks, Bristol (GB); Stewart R. Wyatt, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 446 days.

(21) Appl. No.: 10/790,360

(22) Filed: Mar. 1, 2004

(65) Prior Publication Data

US 2005/0193312 A1    Sep. 1, 2005

(51) Int. Cl.
    *H03M 13/29*    (2006.01)
(52) U.S. Cl. .................................... 714/755
(58) Field of Classification Search ............ 714/755
    See application file for complete search history.

(56) References Cited

U.S. PATENT DOCUMENTS

| | | | |
|---|---|---|---|
| 4,107,650 A | | 8/1978 | Luke et al. |
| 4,972,416 A | * | 11/1990 | Nagai et al. ............... 714/755 |
| 5,311,522 A | * | 5/1994 | Murakami ................. 714/755 |
| 5,754,563 A | | 5/1998 | White |
| 5,805,564 A | * | 9/1998 | Kobayashi et al. ....... 369/275.3 |
| 5,838,267 A | | 11/1998 | Wang et al. |
| 6,023,783 A | * | 2/2000 | Divsalar et al. ............. 714/792 |
| 6,195,764 B1 | | 2/2001 | Caldara et al. |
| 6,216,245 B1 | | 4/2001 | Noda |
| 6,298,461 B1 | | 10/2001 | Tong et al. |
| 6,363,511 B1 | * | 3/2002 | Massoudi .................... 714/755 |
| 6,378,103 B1 | * | 4/2002 | Han ........................... 714/769 |
| 6,400,728 B1 | | 6/2002 | Ott |
| 6,405,338 B1 | | 6/2002 | Sinha et al. |
| 6,425,107 B1 | | 7/2002 | Caldara et al. |
| 6,772,385 B2 | * | 8/2004 | Ohyama et al. ............. 714/755 |
| 6,836,869 B1 | | 12/2004 | Wyland |
| 2002/0056065 A1 | | 5/2002 | Jung et al. |

FOREIGN PATENT DOCUMENTS

| | | |
|---|---|---|
| EP | 0579131 A2 | 1/1994 |
| EP | 0729150 B1 | 12/2003 |
| WO | WO 95/23384 | 8/1995 |
| WO | WO 03/085841 A2 | 10/2003 |

* cited by examiner

*Primary Examiner*—Stephen M Baker

(57) ABSTRACT

A system for error correction coding and decoding information is disclosed. In one embodiment, the first and second encoders are each configured to encode the information, wherein the second encoder has a higher capability than the first encoder. First and second decoders are configured to recover the information, wherein the second decoder recovers the information encoded by the second encoder only if the first decoder cannot recover the information.

14 Claims, 4 Drawing Sheets

SYSTEM FOR ERROR CORRECTION CODING AND DECODING

BACKGROUND OF THE INVENTION

Error detection and correction codes are widely used in communication and storage systems to provide reliable information transmission and recovery. Communication systems can be susceptible to errors in the form of signal degradation which results in distortion or noise in transmitted signals. Signal degradation can also result in a loss of transmitted information. Systems which are susceptible to signal degradation or information loss include wireless or mobile communications systems such as cellular telephone, microwave systems, satellite communications systems, digital television and high speed communications systems such as those that utilize an xDSL communication standard.

Memory storage systems can also be susceptible to errors which result in a loss of stored information. The errors can occur from reliability degradation which causes physical failures within individual memory storage devices. Failure mechanisms which can result from reliability degradation include time dependent dielectric breakdown and electromigration, both common in complementary metal oxide semiconductor (CMOS) integrated circuits.

A number of error correction techniques exist which can be used to detect and correct errors in information, or counteract the effects of signal degradation. The error correction techniques typically use additional amounts of information which can be added to the original stored or transmitted information. The additional information is generated from an error correction code, and is used to check the validity of the original information. The most common types of error correction codes are convolutional (tree) codes and block codes. With these codes, the information is separated into blocks, and each block is encoded into a larger block of data.

Error correction codes can have varying abilities to detect and correct errors. Stronger error detection and correction codes, for example, will allow information to be transmitted and received with lower error rates. These stronger error correction codes usually require more powerful processors or controllers to execute the codes and transmit or store the additional error correction code bits.

The strength of the error correction code is typically chosen for a particular system or application. Once a particular error correction code is chosen for the system or application, the associated execution time or latency time is fixed. In other words, if a higher degree of reliability is required, and high latency error correction routines are used, the system or application will always have the same throughput, even if the reliability requirements are later reduced.

SUMMARY OF THE INVENTION

Embodiments of the present invention provide a system and method for error correction coding and decoding of information. In one embodiment, first and second encoders are each configured to encode the information, wherein the second encoder has a higher capability than the first encoder. The first and second decoders are configured to recover the information, wherein the second decoder recovers the information encoded by the second encoder only if the first decoder cannot recover the information.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

Figure 1:
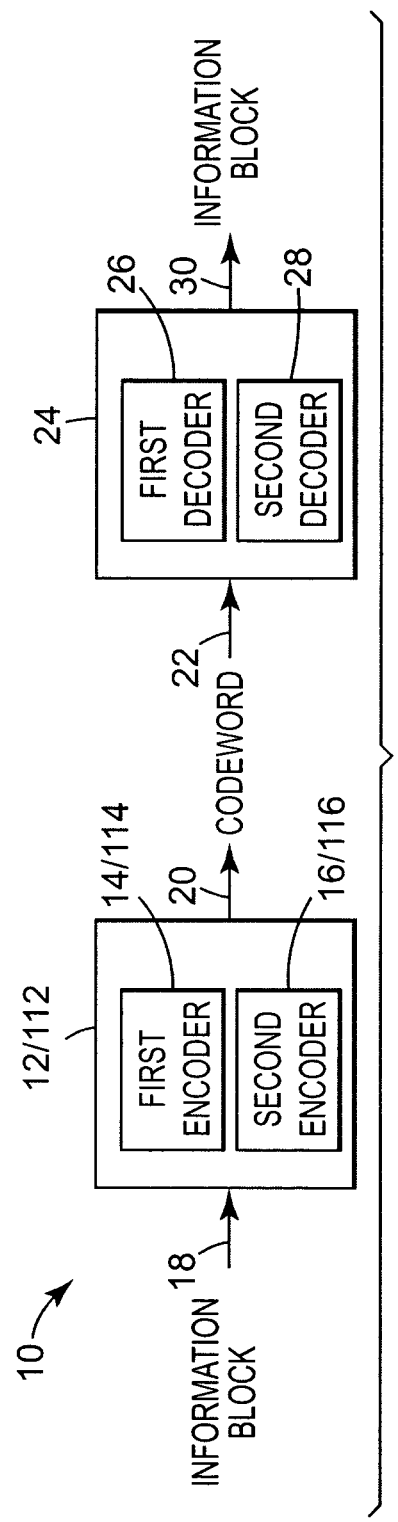
FIG. 1 is a diagram illustrating an exemplary embodiment of a system for error correction coding and decoding.

FIG. 1 is a diagram illustrating an exemplary embodiment of a system for error correction coding and decoding. The system 10 includes an encoding system 12/112 and a decoding system illustrated at 24. The encoding system 12/112 includes a first encoder 14/114 and a second encoder 16/116. An information block or block of digital data is provided at input 18. The information block is encoded to produce a codeword at 20 by combining the information, first parity symbols generated by first encoder 14/114 and second parity symbols generated by second encoder 16/116. The format of the information block and codeword is described in more detail in FIG. 2. In the exemplary embodiment, the second encoder 16/116 has a higher capability to detect and correct errors than the first encoder 14/114. The second encoder generates a number of second parity symbols which is greater than the number of the first parity symbols. The increased number of second parity symbols allows a greater number of errors or erasures to be detected and corrected. In a first exemplary embodiment, the information block is encoded by combining the information, the first parity symbols generated when the first encoder 14 encodes the information, and the second parity symbols generated when the second encoder 16 encodes the information. In a second exemplary embodiment, the second encoder encodes both the information and the first parity symbols.

In the exemplary embodiment, the decoder system 24 includes a first decoder 26 and a second decoder 28. Decoder system 24 decodes the codeword, which is provided at input 22, and provides the information block at output 30. In the exemplary embodiment, the information block at output 30 is equivalent to the information block at 18. In other embodiments, substantial portions of the information block at 18 and 30 are equivalent.

In the exemplary embodiment, first decoder 26 is configured to recover the information block by detecting and correcting errors and erasures using the first parity symbols generated when first encoder 14/114 encodes the information. The first decoder 26 provides an indication if the information block cannot be recovered from the codeword provided at input 22. In other embodiments, any suitable approach can be used to indicate that the information block cannot be recovered. In the exemplary embodiment, second decoder 28 is configured to recover the information using the second parity symbols generated when second encoder 16/116 encodes the information. The second decoder recovers the information block only if the first decoder 26 cannot detect and correct one or more errors and erasures, or if the first decoder 26 provides the indication. In various embodiments, the indication is a flag or signal which indicates that the information block was not recovered by the first decoder 26.

In the exemplary embodiment, second decoder 28 is configured to recover the information by using second parity symbols. In a first exemplary embodiment, the second parity symbols are generated when second encoder 16 encodes the information block (see also, FIG. 3). In a second exemplary embodiment, the second parity symbols are generated when the second encoder 116 encodes both the information block and the first parity symbols generated when the first encoder 114 encodes the information block (see also, FIG. 5).

In various embodiments, any suitable error correction code can be used. In one embodiment, the first and second encoders and the first and second decoders use a Reed-Solomon code. Reed-Solomon codes are block-based error correcting codes which are used for a wide range of communication and storage applications. In another embodiment, the first and second encoders and first and second decoders use a linear block code. In one embodiment, the linear block code is a cyclic redundancy check code. In another embodiment, first encoder and first decoder use a cyclic redundancy check (CRC) with error detection capability and with no correction capability. The second encoder and second decoder use a Reed-Solomon code with error correction capability. In other embodiments, the first and second encoders and first and second decoders use other suitable error correction and detection codes, such as a convolutional code, first-correcting code, a hamming code, etc.

In one embodiment, the first encoder 14/114 and the second encoder 16/116 use the Reed Solomon code to encode the information block. The Reed-Solomon code is specified using (n,k) with s-bit symbols. First encoder 14/114 or second encoder 16/116 take k data symbols of s bits each and add parity symbols to make an n symbol codeword. There are n−k parity symbols of s bits each in the codeword. First decoder 26 or second decoder 28 decode the codeword and can correct up to t symbols that contain errors in the codeword, where 2t=n−k. Because the second encoder 16/116 generates the number of second parity symbols which is greater than the number of first parity symbols generated by the first encoder 14/114, the second decoder 28 can detect and correct a greater number of errors or erasures than the first decoder 26.

In one exemplary embodiment using the Reed-Solomon code, first encoder 14/114 accepts one byte (or symbol) at a time until it has processed a 128-btye information block. First encoder 14/114 accepts an information block at input 18 in the byte format, and takes one or more bytes of latency time to process the information. In the exemplary embodiment, the codeword at 20 is also in a byte format. Second encoder 16/116 also processes the information in a byte format, and has a latency time of one or more times to process the information. In one embodiment, first encoder 14/114 and first decoder 26 have a stronger error detection capability and a weaker error correction capability than second encoder 16/116 and second decoder 28.

In various embodiments, encoding data using first encoder 14/114 and second encoder 16/116 is a relatively simple operation, and as such, the encoding process can be easily synthesized using electrical circuits or transistor gates. The performance penalty incurred for encoding the information block using first encoder 14/114 versus second encoder 16/116 is minimal, and generating the additional parity symbols in the second parity symbols has a minimal impact on the byte time latency necessary to process the codeword.

In the exemplary embodiment, first encoder 14/114 generates a number of first parity symbols or bits which are used by first decoder 26 to decode the codeword at input 22 into the information block at output 30. First decoder 26 has a latency time to process the codeword into the information block at output 30 which is less than the latency time of second decoder 28. If the error detection and correction capability of first decoder 26 is insufficient to correct errors detected in the codeword, the second decoder 28 decodes the codeword into the information block at 30. Second decoder 28 has a higher latency time than first decoder 26, but only decodes the codeword at 22 into the information block at 30 when first decoder 26 cannot correct the errors or erasures, or when first decoder 26 provides an indication that the errors or erasures cannot be corrected. In the exemplary embodiment, first decoder 26 and second decoder 28 process the codeword which includes the information block and the parity symbols, and detects and corrects any erasures which exist. With the Reed-Solomon system, the latency time of the first decoder 26 or the second decoder 28 can be significantly greater than the latency time of the first encoder 14/114 or the second encoder 16/116. In one exemplary embodiment, first decoder 26 and second decoder 28 require significantly more electrical circuits or transistor gates to synthesize than first encoder 14/114 and second encoder 16/116.

Figure 2:
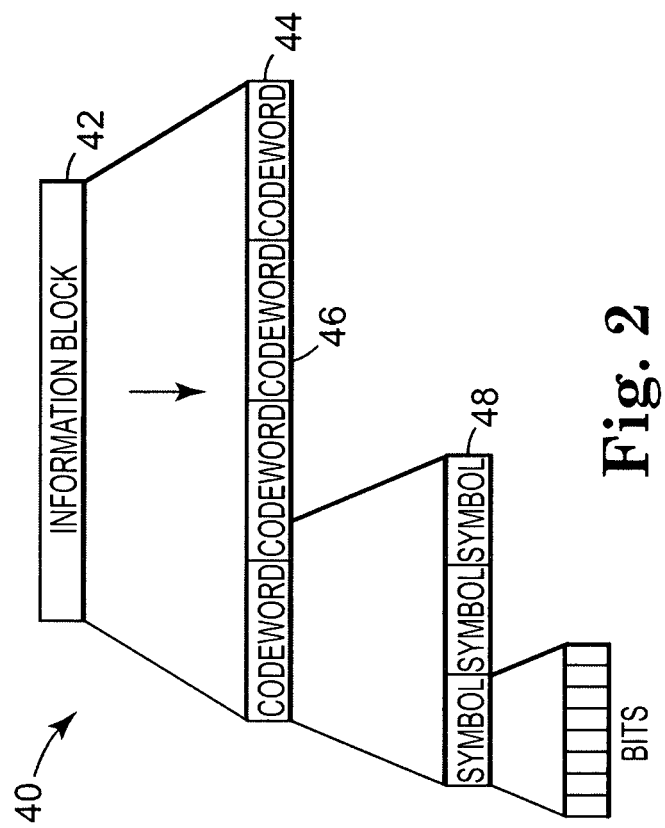
FIG. 2 is a diagram illustrating an exemplary embodiment of a logical data structure.

FIG. 2 is a diagram illustrating an exemplary embodiment of a logical data structure. In one embodiment, original information 42 is received in predetermined units such as a sector comprising 512 bytes. In the exemplary embodiment, error correction coding is performed to produce a block of encoded data 44, in this case an encoded sector. The encoded sector 44 comprises a plurality of symbols 48, which can be a single bit (e.g. a BCH code with single bit symbols) or can comprise multiple bits (e.g. a Reed-Solomon code using multi-bit symbols). In one Reed-Solomon encoding scheme, each symbol 48 conveniently comprises eight bits. As shown in FIG. 2, the encoded sector 44 comprises four codewords 46, each comprising a number of symbols, such as 144 to 160 symbols. In one embodiment, the eight bits corresponding to each symbol are conveniently stored in eight storage cells of a memory storage device. In the exemplary embodiment, a failure which affects any of the eight storage cells can result in one or more of the bits being unreliable (i.e. the wrong value is read) or unreadable (i.e. no value can be obtained), thus giving a failed symbol.

In the exemplary embodiment, error correction decoding the encoded data 44 allows failed symbols 48 to be identified and corrected. The preferred Reed-Solomon scheme is an example of a linear error correcting code, which mathematically identifies and corrects completely up to a predetermined maximum number of failed symbols 48, depending upon the power of the code. For example, a [160,128,33] Reed-Solomon code producing codewords having 160 bit symbols corresponding to 128 original information bytes and a minimum distance of 33 symbols can locate and correct up to 16 symbol errors. Suitably, the ECC scheme employed is selected with a power sufficient to recover original information 42 from the encoded data 44.

Figure 3:
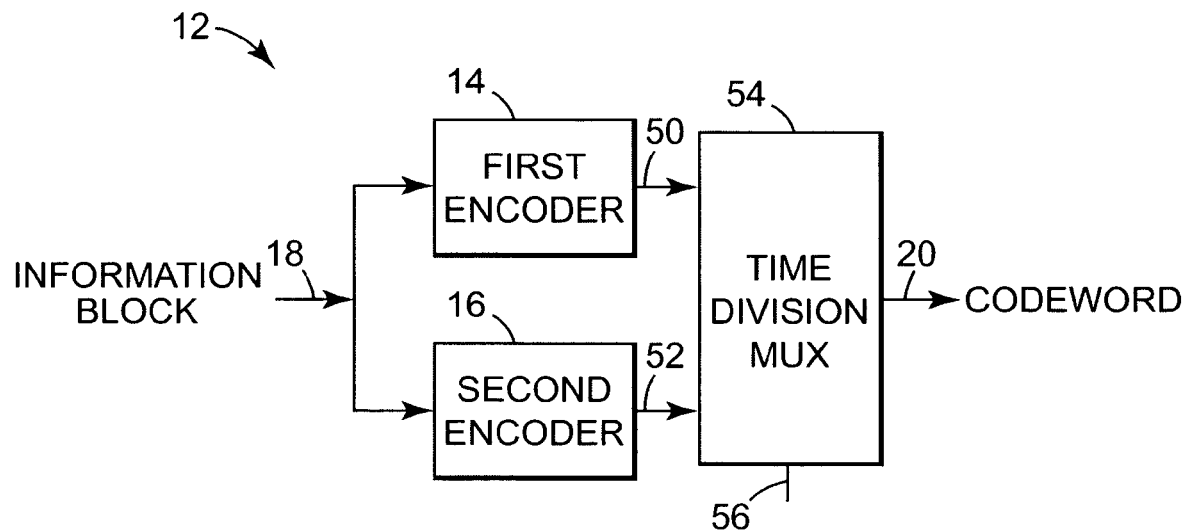
FIG. 3 is a diagram illustrating a first embodiment of first and second encoders.

FIG. 3 is a diagram illustrating a first embodiment of first and second encoders 14 and 16. The encoding system is shown generally at 12. First encoder 14 and second encoder 16 are configured to encode the information. In the exemplary embodiment, the second encoder 16 has a higher capability than the first encoder 14. By "higher capability," it is meant that the second encoder 16 can correct a larger number of errors than first encoder 14. For example, first encoder 14 may utilize a Reed-Solomon code producing codewards of 132 eight-bit symbols corresponding to 128 original data bytes that can locate and correct up to two random errors in 132 bytes. Second encoder 16 may utilize a Reed-Solomon code having a high capability relative to first encoder 14, producing codewords of 160 eight-bit symbols corresponding to 128 original data bytes that can locate and correct up to 16 random errors in 160 bytes.

First encoder 14 and second encoder 16 each include as an input the information block at 18. First encoder 14 has an output 50 which is coupled to an input of a time division multiplexer 54. Second encoder 16 has an output 52 which is coupled to an input of time division multiplexer 54. Time division multiplexer 54 has a select input at 56 which selects between output 50 of first encoder 14 and output 52 of second encoder 16. The selected codeword at input 50 or input 52 is coupled to an output at 20. In the exemplary embodiment, any suitable means can be used to provide a control input at 56 to time division multiplexer 54 to select between input 50 and input 52. Time division multiplexer 54 is configured to combine the information block, the first parity symbols generated by first encoder 14 and the second parity symbols generated by second encoder 16 into the codeword. The codeword is illustrated in FIG. 4.

In the exemplary embodiment, second encoder 16 has a higher capability than first encoder 14, and as such, second encoder 16 generates a number of the second parity symbols which is greater than a number of the first parity symbols generated by first encoder 14. In the exemplary embodiment, the block of information at 18 is fed simultaneously to first encoder 14 and second encoder 16. First encoder 14 encodes the information block at 18 into a codeword which includes the information block and first parity symbols. Second encoder 16 encodes the information block at 18 into a codeword at 52 which includes the information block and second parity symbols. Time division multiplexer 54 multiplexes the information block, the first parity symbols and the second parity symbols into the codeword which is provided at output 20.

Figure 4:
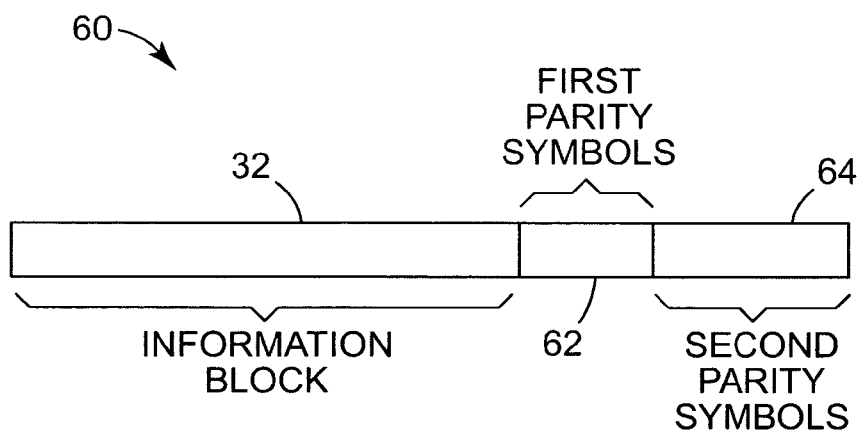
FIG. 4 is a diagram illustrating a first embodiment of a codeword.

FIG. 4 is a diagram illustrating a first embodiment of a codeword. The codeword is illustrated generally at 60. The codeword includes the information block which is illustrated at 32, first parity symbols which are illustrated at 62 and second parity symbols which are illustrated at 64. Time division multiplexer 54 combines the information block, the first parity symbols and the second parity symbols into the single codeword format illustrated at 60. The information is encoded to produce a codeword by combining the information, first parity symbols generated when the first encoder encodes the information and the second parity symbols generated when the second encoder encodes the information.

In one embodiment, first encoder 14 is a first error correction coding (ECC) encoder circuit which is configured to generate first parity symbols. Second encoder 16 is a second ECC encoder circuit that is configured to generate second parity symbols. The number of the second parity symbols is greater than the number of the first parity symbols. The first parity symbols, the second parity symbols and the information block or data are combined into a codeword at 20.

Figure 5:
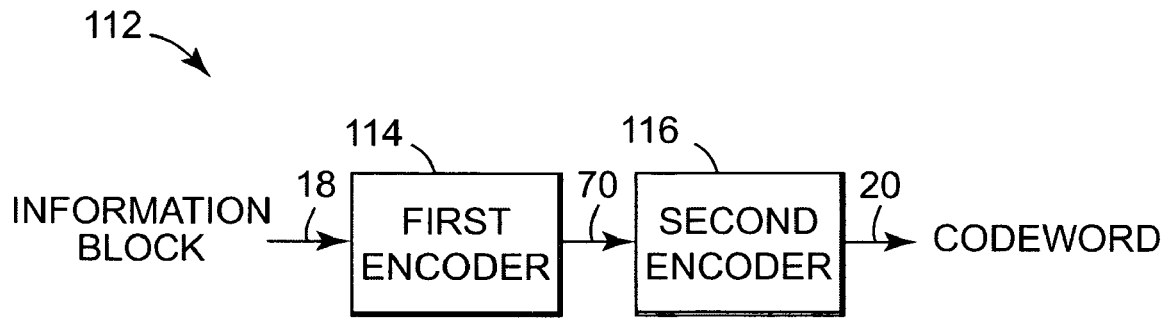
FIG. 5 is a diagram illustrating a second embodiment of first and second encoders.

FIG. 5 is a diagram illustrating a second embodiment of first and second encoders. The encoding system is illustrated generally at 112. First encoder 114 and second encoder 116 are configured to encode the information block received at 18. Second encoder 116 has a higher capability than first encoder 114. In the exemplary embodiment, second encoder 116 generates a number of the second parity symbols which are greater than the number of first parity symbols generated by the first encoder 114.

In the exemplary embodiment, an information block is input at 18 to first encoder 114. First encoder 114 generates an output at 70 which includes the information block and first parity symbols appended to the information block. The output codeword from first encoder 114 at line 70 is fed into the second encoder 116. Second encoder 116 appends second parity symbols to the codeword received at 70, and outputs a codeword at 20 which includes both the first parity symbols and the second parity symbols. In the exemplary embodiment, the encoding system 112 encodes the information block and provides an output codeword at 20 which includes the information block, first parity symbols generated when first encoder 114 encodes the information, and second parity symbols generated when second encoder 116 encodes both the information block and the first parity symbols.

In one exemplary embodiment, first encoder 114 and second encoder 116 are error correction coding (ECC) circuits. First ECC encoder circuit 114 is configured to generate first parity symbols from the information block or data. Second ECC encoder circuit 116 is configured to generate second parity symbols from the output of first encoder 114 at 70. The second parity symbols are generated from both the information block and the first parity symbols. The number of the second parity symbols is greater than the number of the first parity symbols. The first parity symbols, the second parity symbols and the information or data are combined into the codeword at output 20.

Figure 6:
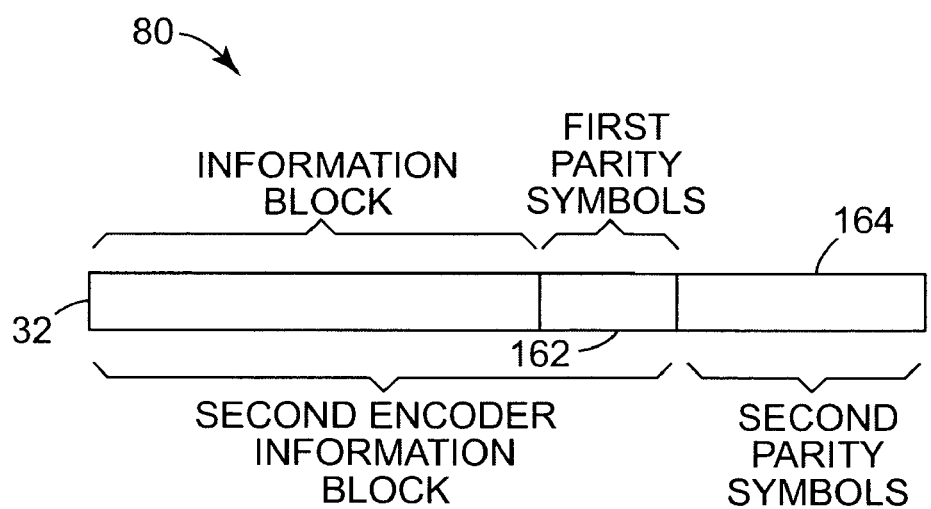
FIG. 6 is a diagram illustrating a second embodiment of a codeword.

FIG. 6 is a diagram illustrating a second embodiment of a codeword. The codeword is illustrated generally at 80. The codeword 80 includes the information block at 32, first parity symbols at 162 and second parity symbols at 164. The information block is provided at input 18 to first encoder 114. The output of first encoder 114 at 70 is illustrated as a second encoder information block and includes the information block at 32 and the first parity symbols at 162. The output of second encoder 116 at 20 includes the information block at 32, the first parity symbols at 162 and the second parity symbols at 164, which are appended into a single codeword 80.

Figure 7:
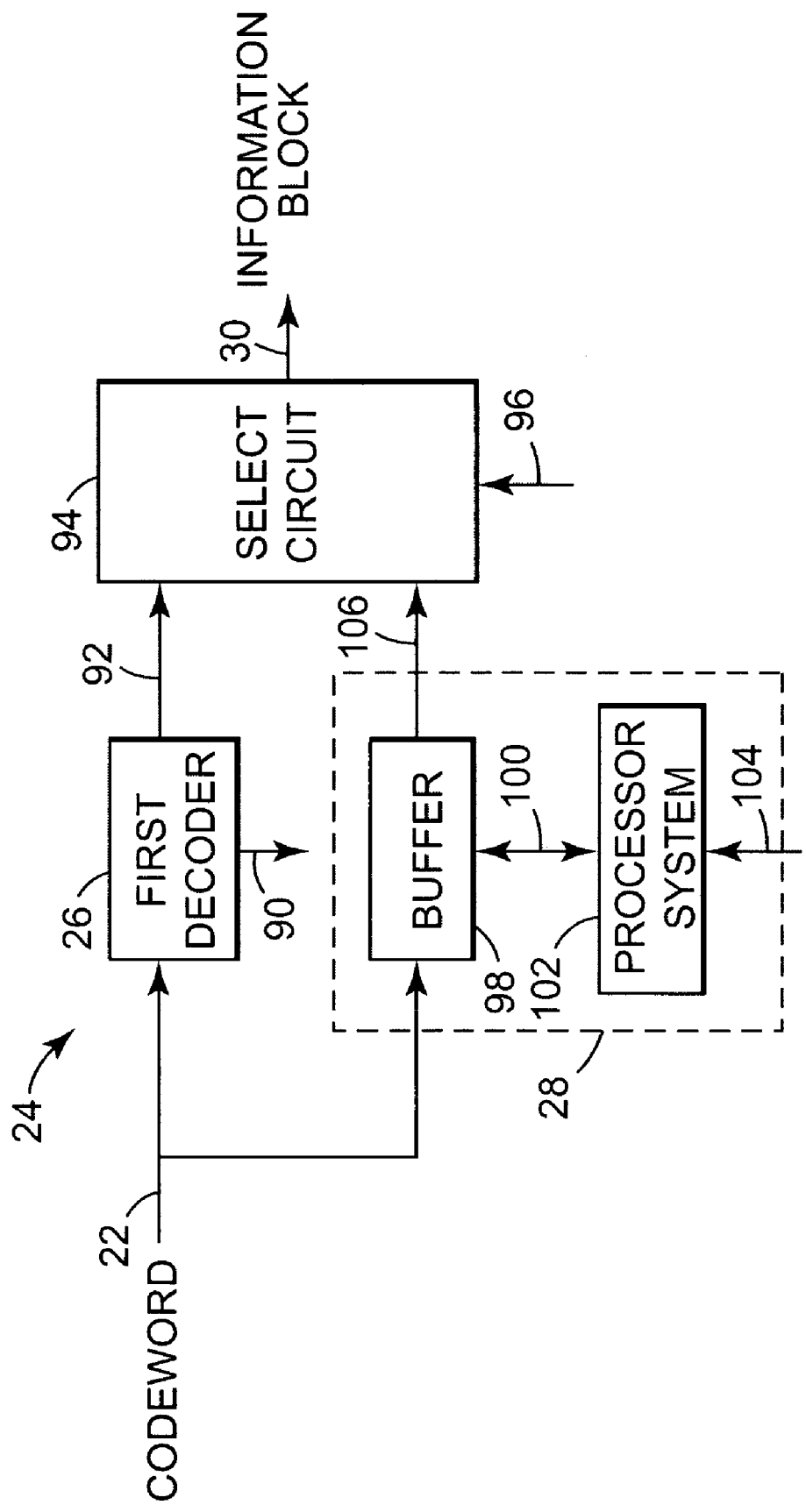
FIG. 7 is a diagram illustrating an exemplary embodiment of first and second decoders.

FIG. 7 is a diagram illustrating an exemplary embodiment of first and second decoders 26 and 28. The decoder system is illustrated generally at 24. In first and second exemplary embodiments, first decoder 26 is configured to recover the information block using first parity symbols generated when the first encoder 14/114 encodes the information block. In the first and second exemplary embodiments, first decoder 26 is configured to provide an indication if the information block cannot be recovered. In the first and second exemplary embodiments, the indication is an output flag provided at 90. In other embodiments, the indication can be provided by any suitable means. In the first exemplary embodiment, second decoder 28 is configured to recover the information block by using second parity symbols generated when the second encoder 16 encodes the information block. In the second exemplary embodiment, second decoder 28 is configured to recover the information block using second parity symbols generated when second encoder 116 encodes both the information block and the first parity symbols. In the first and second exemplary embodiments, the second decoder 28 recovers the information block only if the first decoder 26 provides the indication at 90.

In the exemplary embodiment, second decoder 28 includes a buffer 98, a processor system 102, wherein buffer 98 is coupled to processor system 102 via line 100. Buffer 98 is configured to store the information block and the second parity symbols. Processor system 102 is configured to recover the information block by using the second parity symbols only if the first decoder 26 provides the indication at 90. Processor system 102 includes an input at 104 which is configured to receive the indication provided at 90. In various embodiments, suitable control circuitry (not illustrated) has the output at 90 as an input and provides an output to the input at 104 to control processor system 102. The output of first decoder 26 at 92 and the output of second decoder 28 at 106 couple into a select circuit at 94. Select circuit 94 selects, via a control input provided at 96, either the codeword provided by first decoder 26 which is provided at 92, or the codeword provided by second decoder 28, which is provided at 106. Select circuit 94 outputs the selected information block at 30.

In the exemplary embodiment, first decoder 26 recovers the information using the first parity symbols to detect and correct any errors in the information block. Second decoder 28 recovers the information using the second parity symbols to detect and correct any errors in the information block.

In the exemplary embodiment, the codeword provided at 22 is an input to first decoder 26 and second decoder 28. The information portion of the codeword is provided to first decoder 26 along with the first parity symbols. First decoder 26 determines whether there are errors or erasures in the codeword using the first parity symbols. If there are no errors or erasures detected, first decoder 26 discards the first parity symbols and the second parity symbols from the codeword, and provides the information block at output 92. If there are errors in the codeword, first decoder 26 determines whether the errors or erasures can be corrected. If first decoder 26 can correct the errors or erasures in the codeword, the corrected information is provided at 92, and both the first parity symbols and the second parity symbols are discarded. If there are errors or erasures in the codeword which first decoder 26 cannot correct, first decoder 26 provides an indication at 90 to input 104 of processor system 102 to indicate that first decoder 26 has encountered an unrecoverable error. In the exemplary embodiment, the codeword is stored in buffer 98. Processor 102 uses a suitable hardware or software algorithm along with the parity from second encoder 16/116 to correct the errors or erasures in the information. Once the processor system 102 completes the execution of the algorithm and corrects any errors or erasures in the information within the codeword, the processor discards the first parity symbols and the second parity symbols and outputs the information block at 106. Select circuit 94 selects either the information block provided at 92 from first decoder 26 or the information block provided at 106 from second decoder 28. Suitable control circuitry (not illustrated) provides a control input at 96 to make the selection. The selected information block is output at 30.

In an exemplary method of error correction coding of information, a number of first parity symbols are generated from the information block. The first parity symbols are generated by first encoder 14/114. Next, a number of second parity symbols are generated from the information block by second encoder 16/116. In the exemplary embodiment, the number of the second parity symbols is greater than the number of the first parity symbols. Next, the first parity symbols, the second parity symbols and the information are combined into an encoded data block.

In an exemplary method of decoding the information block, the information block is recovered from the codeword or encoded data block using the first parity symbols if the information block can be recovered using the first parity symbols. The information is recovered from the codeword or encoded data block using the second parity symbols only if the information cannot be recovered using the first parity symbols.

In the exemplary method, the information block is recovered from the codeword or encoded data block using the first parity symbols and includes detecting and correcting errors or erasures in the information block which can be detected or corrected using the first parity symbols. In the exemplary method, the information block is recovered from the codeword or encoded data block using the second parity symbols and includes detecting or correcting errors or erasures in the information block which can be detected or corrected using the second parity symbols. In one embodiment, generating a number of the second parity symbols from the information block includes generating a number of the second parity symbols from both the first parity symbols and the information block. In this embodiment, recovering the information block from the codeword or encoded data block using the second parity symbols includes detecting or correcting errors in the first parity symbols and the information block using the second parity symbols.

What is claimed is:

1. An error correction system for coding and decoding at least one information block, comprising:
   first and second encoders each configured to encode the at least one information block,
      wherein the first encoder generates first parity symbols during encoding of the at least one information block, and
      wherein the second encoder generates second parity symbols during encoding of the at least one information block, with a quantity of the second parity symbols being greater than a quantity of the first parity symbols; and
   first and second decoders configured to recover the at least one information block,
      wherein the first decoder and the second decoder are configured to operate sequentially in time with the first decoder acting first and the second decoder acting second;
      wherein the first decoder is configured to recover the at least one information block using the first parity symbols, and
      wherein the second decoder is configured to recover the at least one information block via the second parity symbols with the second decoder configured to remain inactive during operation of the first decoder and further remain inactive after operation of the first decoder unless the first decoder is unsuccessful in attempting to recover the at least one information block and until the first decoder provides an indication to the second decoder to recover the at least one information block.

2. The system of claim 1, wherein the at least one information block is encoded to produce a codeword by combining the information, the first parity symbols, and the second parity symbols.

3. The system of claim 2, comprising:
   a multiplexer configured to combine the at least one information block, the first parity symbols and the second parity symbols into the codeword.

4. The system of claim 3, wherein the at least one information block is encoded by combining the at least one information block, the first parity symbols, and the second parity symbols generated when the second encoder encodes both the at least one information block and the first parity symbols.

5. The system of claim 4, wherein the second decoder is configured to recover the at least one information block by using second parity symbols generated when the second encoder encodes both the at least one information block and the first parity symbols.

6. The system of claim 1, wherein the second decoder comprises:
a register configured to store the at least one information block and the second parity symbols; and
a processor system configured to recover the at least one information block by using second parity symbols only if the first decoder provides the indication.

7. A storage system having an error correction system for coding and decoding at least one information block, comprising:
a first encoder configured to encode the at least one information block using first parity symbols;
a second encoder configured to encode the at least one information block by applying second parity symbols which are greater in number than the first parity symbols to enable locating and correcting a larger number of errors than the first encoder;
a first decoder configured to recover the at least one information block;
a second decoder configured to recover the at least one information block sequentially in time after operation of the first decoder, wherein the second decoder initiates action to recover the at least information block only after completion by the first decoder of an unsuccessful attempt to recover the at least one information block, and further wherein the first and second encoders and the first and second decoders use an error correcting code;
wherein the first decoder and the second decoder are configured to recover the at least one information block via separating the at least one information block from the first parity symbols and the second parity symbols, respectively.

8. The system of claim 7, wherein the first and second encoders and the first and second decoders use a cyclic redundancy check code.

9. The system of claim 7, wherein the first and second encoders and the first and second decoders use a burst-correcting code.

10. A method of error correction coding and decoding information, comprising:
generating a number of first parity symbols from the information;
generating a number of second parity symbols from the information, wherein the number of the second parity symbols is greater than the number of the first parity symbols;
combining the first parity symbols, the second parity symbols and the information into an encoded data block;
recovering the information from the encoded data block, if no errors are present in the encoded data block, via disassembling the encoded data block by removing both the first parity symbols and the second parity symbols from the information;
recovering the information from the encoded data block, if an error is present in the encoded data block, by first using the first parity symbols if the information is capable of being recovered using the first parity symbols; and
recovering the information from the encoded data block, after using the first parity symbols, by second using the second parity symbols only if recovery of the information was not accomplished by using the first parity symbols.

11. The method of claim 10, wherein generating a number of the second parity symbols from the information includes generating the number of the second parity symbols from both the first parity symbols and the information.

12. The method of claim 10, wherein recovering the information from the encoded data block using the first parity symbols includes detecting or correcting errors in the information which can be detected or corrected using the first parity symbols.

13. The method of claim 10, wherein recovering the information from the encoded data block using the second parity symbols includes detecting or correcting errors in the information which can be detected or corrected using the second parity symbols.

14. The method of claim 10, wherein recovering the information from the encoded data block using the second parity symbols includes detecting or correcting errors in the first parity symbols and the information using the second parity symbols.

* * * * *

UNITED STATES PATENT AND TRADEMARK OFFICE
CERTIFICATE OF CORRECTION

PATENT NO. : 7,418,644 B2 Page 1 of 1
APPLICATION NO. : 10/790360
DATED : August 26, 2008
INVENTOR(S) : Kenneth Kay Smith et al.

It is certified that error appears in the above-identified patent and that said Letters Patent is hereby corrected as shown below:

In column 8, line 41, in Claim 1, delete "second;" and insert -- second, --, therefor.

Signed and Sealed this

Seventeenth Day of February, 2009

JOHN DOLL
*Acting Director of the United States Patent and Trademark Office*